US008703389B2

(12) United States Patent
Fujimura et al.

(10) Patent No.: US 8,703,389 B2
(45) Date of Patent: Apr. 22, 2014

(54) METHOD AND SYSTEM FOR FORMING PATTERNS WITH CHARGED PARTICLE BEAM LITHOGRAPHY

(75) Inventors: Akira Fujimura, Saratoga, CA (US); Ingo Bork, Mountain View, CA (US)

(73) Assignee: D2S, Inc., San Jose, CA (US)

( * ) Notice: Subject to any disclaimer, the term of this patent is extended or adjusted under 35 U.S.C. 154(b) by 403 days.

(21) Appl. No.: 13/168,953

(22) Filed: Jun. 25, 2011

(65) Prior Publication Data

US 2012/0329289 A1 Dec. 27, 2012

(51) Int. Cl.
*G03F 1/20* (2012.01)
*G03C 5/00* (2006.01)
*G03F 7/20* (2006.01)
*H01L 21/027* (2006.01)

(52) U.S. Cl.
CPC ............... *G03F 7/2037* (2013.01); *G03F 1/20* (2013.01); *H01L 21/027* (2013.01); *Y10S 430/143* (2013.01)
USPC .................. 430/296; 430/5; 430/30; 430/942

(58) Field of Classification Search
CPC ........ G03F 1/20; G03F 7/2037; H01L 21/027
USPC ........................................ 430/5, 30, 296, 942
See application file for complete search history.

(56) References Cited

U.S. PATENT DOCUMENTS

| | | | |
|---|---|---|---|
| 6,037,601 A | 3/2000 | Okunuki | |
| 6,416,912 B1 | 7/2002 | Kobayashi et al. | |
| 6,917,048 B2 | 7/2005 | Fujiwara et al. | |
| 7,759,027 B2 | 7/2010 | Fujimura et al. | |
| 7,799,489 B2 | 9/2010 | Fujimura et al. | |
| 7,901,850 B2 | 3/2011 | Fujimura et al. | |
| 2002/0129328 A1 | 9/2002 | Komatsuda | |
| 2005/0053850 A1 | 3/2005 | Askebjer et al. | |
| 2005/0075819 A1 | 4/2005 | Paxton et al. | |
| 2005/0287451 A1 | 12/2005 | Hudek et al. | |
| 2007/0114463 A1 | 5/2007 | Nakasugi et al. | |
| 2007/0162889 A1 | 7/2007 | Broeke et al. | |
| 2008/0116398 A1 | 5/2008 | Hara et al. | |
| 2008/0213677 A1 | 9/2008 | Saito | |
| 2010/0055580 A1 | 3/2010 | Fujimura et al. | |
| 2010/0055585 A1 | 3/2010 | Fujimura et al. | |
| 2010/0058279 A1 | 3/2010 | Fujimura et al. | |
| 2010/0058282 A1 | 3/2010 | Fujimura et al. | |
| 2010/0209834 A1 | 8/2010 | Yao et al. | |
| 2011/0045409 A1 | 2/2011 | Fujimura | |
| 2011/0053056 A1 | 3/2011 | Fujimura et al. | |
| 2011/0177458 A1 | 7/2011 | Kotani et al. | |
| 2011/0191727 A1 | 8/2011 | Fujimura et al. | |
| 2012/0084740 A1 | 4/2012 | Fujimura et al. | |
| 2013/0070222 A1 | 3/2013 | Fujimura | |

FOREIGN PATENT DOCUMENTS

| | | |
|---|---|---|
| JP | 1992-155337 A | 5/1992 |
| WO | 03036386 A | 5/2003 |
| WO | 2010025031 A2 | 3/2010 |
| WO | 2010025032 A2 | 3/2010 |
| WO | 2011025795 A1 | 3/2011 |

OTHER PUBLICATIONS

International Search Report and Written Opinion dated Dec. 20, 2012 for PCT Application No. PCT/US2012/054526.
Notice of Allowance and Fees due dated Mar. 6, 2013 for U.S. Appl. No. 13/168,954.
Office Action dated Dec. 24, 2012 for U.S. Appl. No. 13/1168,954.
International Search Report and Written Opinion dated Jul. 24, 2013 for PCT Application No. PCT/US2013/036671.
International Search Report and Written Opinion dated Jul. 29, 2013 for PCT Application No. PCT/US2013/036669.
Notice of Allowance and Fees dated Aug. 21, 2013 for U.S. Appl. No. 13/924,019.
Notice of Allowance and Fees dated Sep. 30, 2013 for U.S. Appl. No. 13/269,618.
Office Action dated Aug. 30, 2013 for U.S. Appl. No. 13/236,610.
Office Action dated Oct. 1, 2013 for U.S. Appl.No. 13/862,475.
International Search Report and Written Opinion dated Apr. 27, 2012 for PCT Application No. PCT/US2011/1055535.
International Search Report and Written Opinion dated Apr. 30, 2012 for PCT Application No. PCT/US2011/1055536.
Martin, L. et al., "New Writing Strategy in Electron Beam Direct Write Lithography to Improve Critical Dense Lines Patterning for Sub-45nm Nodes", Proceedings of SPIE, vol. 7470 (2009), pp. 74700R-1-74700R-12, SPIE, P.O. Box 10, Bellingham, WA. 98227, U.S.A.
Martin, L. et al., "Development of Multiple Pass Exposure in Electron Beam Direct Write Lithography for Sub-32nm Nodes", Proceedings of SPIE, vol. 7488 (2009), pp. 74881C-1-74881C-12, SPIE, P.O. Box 10, Bellingham, WA. 98227, U.S.A.
International Search Report and Written Opinion dated Sep. 13, 2012 for PCT Patent Application No. PCT/US2012/043042.
Office Action dated Jul. 10, 2012 for U.S. Appl. No. 13/168,954.
Office Action dated May 9, 2013 for U.S. Appl. No. 13/269,618.

*Primary Examiner* — Christopher Young
(74) *Attorney, Agent, or Firm* — The Mueller Law Office, P.C.

(57) ABSTRACT

In a method for fracturing or mask data preparation or mask process correction for charged particle beam lithography, a plurality of shots are determined that will form a pattern on a surface, where shots are determined so as to reduce sensitivity of the resulting pattern to changes in beam blur ($\beta_f$). At least some shots in the plurality of shots overlap other shots. In some embodiments, $\beta_f$ is reduced by controlling the amount of shot overlap in the plurality of shots, either during initial shot determination, or in a post-processing step. The reduced sensitivity to $\beta_f$ expands the process window for the charged particle beam lithography process.

28 Claims, 8 Drawing Sheets

METHOD AND SYSTEM FOR FORMING PATTERNS WITH CHARGED PARTICLE BEAM LITHOGRAPHY

RELATED APPLICATIONS

This application is related to U.S. patent application Ser. No. 13/168,954 filed on Jun. 25, 2011 entitled "Method and System for Forming High Accuracy Patterns Using Charged Particle Beam Lithography"; which is hereby incorporated by reference for all purposes.

BACKGROUND OF THE DISCLOSURE

The present disclosure is related to lithography, and more particularly to the design and manufacture of a surface which may be a reticle, a wafer, or any other surface, using charged particle beam lithography.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks, or even other reticles. While conventional optical lithography uses a light source having a wavelength of 193 nm, extreme ultra-violet (EUV) or X-ray lithography are also considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, or magnetic recording heads.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical or non-optical lithography while others may be written using maskless direct write to fabricate the same substrate. Also, some patterns of a given layer may be written using optical or non-optical lithography, and other patterns written using maskless direct write. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on an interior or exterior corner of a pattern to sharpen the corner in the final transferred image. It is often the case that the precision demanded of the surface manufacturing process for SRAFs are less than those for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations such as corner rounding will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask. As process nodes continue to shrink, the size of the smallest SRAFs on a photomask also shrinks For example, at the 20 nm logic process node, 40 nm to 60 nm SRAFs are needed on the mask for the highest precision layers.

EUV optical lithography has a much higher resolution than conventional optical lithography. The very high resolution of EUV significantly reduces the need for OPC processing, resulting in lower mask complexity for EUV than for 193 nm optical lithography. However, because of the very high resolution of EUV, imperfections in a photomask, such as excessive line edge roughness (LER), will be transferred to the wafer. Therefore, the accuracy requirements for EUV masks are higher than those for conventional optical lithography. Additionally, even though EUV mask shapes are not complicated by the addition of complex SRAFs or serifs required for conventional 193 nm lithography, EUV mask shapes are complicated by an addition of some complexities unique to EUV manufacturing. Of particular relevance in writing patterns on masks for EUV lithography is mid-range scattering of charged particles such as electrons, which may affect a radius of about 2 um. This midrange scattering introduces a new consideration for mask data preparation, because for the first time the influence from neighboring patterns has significant impact on the shape that a particular pattern would cast onto the mask surface. Previously, when exposing masks for use with conventional 193 nm lithography, the short-range scattering affected only the pattern being written, and the long-range scattering had a large enough effective range that only the size of a pattern, and not its detailed shape, was affected, making it possible to make corrections by only using dose modulation. In addition, since EUV processing of wafers is more expensive, it is desirable to reduce or eliminate multiple patterning. Multiple patterning is used in conventional optical lithography to allow exposure of small features by exposing patterns for one layer of wafer processing using multiple masks, each of which contains a portion of the layer pattern. Reducing or eliminating multiple exposures requires the single mask to contain more fine patterns. For example, a series of collinear line segments maybe double-patterned by first drawing a long line, then cutting the line into line segments by a second mask in conventional lithography. The same layer written with a single mask, such as for EUV lithography, would require a mask containing many smaller line segments. The need to write larger numbers of finer patterns on a single mask, each pattern needing to be more accurate, increases the need for precision on EUV masks.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are conventionally designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

Current optical lithography writing machines typically reduce the photomask pattern by a factor of four during the optical lithographic process. Therefore, patterns formed on a reticle or mask must be four times larger than the size of the desired pattern on the substrate or wafer.

Manufacturing variations can cause variation in the size and shape of a pattern manufactured on a surface such as a wafer or reticle using a given set of charged particle beam lithography shots. Manufacturing variations may, for example, cause variation in critical dimensions (CD) of the manufactured pattern. Sources of this manufacturing variation include variation in particle beam intensity, unintended variation in exposure time and variation in resist sensitivity. The term dose margin describes the tolerance of a pattern defined by a set of charged particle beam shots to dosage-related manufacturing variations. A higher dose margin indicates a higher tolerance.

Dose margin is a typical measure for manufacturing tolerance. But there are other sources of manufacturing variation. In a world where overlapped or dose-modulated shots are used, sensitivity to beam blur or $\beta_f$, which includes the physical effects of forward scattering, Coulomb effect and resist diffusion, can also be an issue.

SUMMARY OF THE DISCLOSURE

A method for fracturing or mask data preparation or mask process correction for charged particle beam lithography is disclosed in which a plurality of shots are determined that will form a pattern on a surface, where shots are determined so as to reduce sensitivity of the resulting pattern to changes in $\beta_f$. At least some shots in the plurality of shots overlap other shots. In some embodiments, sensitivity of the pattern to changes in $\beta_f$ is reduced by controlling the amount of shot overlap in the plurality of shots, either during initial shot determination, or in a post-processing step. The reduced sensitivity to $\beta_f$ expands the process window for the charged particle beam lithography process.

Methods for forming patterns on a surface, and for manufacturing an integrated circuit are also disclosed, in which pattern sensitivity to changes in $\beta_f$ is reduced.

DETAILED DESCRIPTION OF THE EMBODIMENTS

The improvements and advantages of the present disclosure can be accomplished by controlling the parameters of the shots forming a pattern, so as to reduce the magnitude of pattern variations caused by variation of $\beta_f$, thereby allowing higher quality patterns to be formed on reticles and other surfaces such as wafers.

Figure 1:
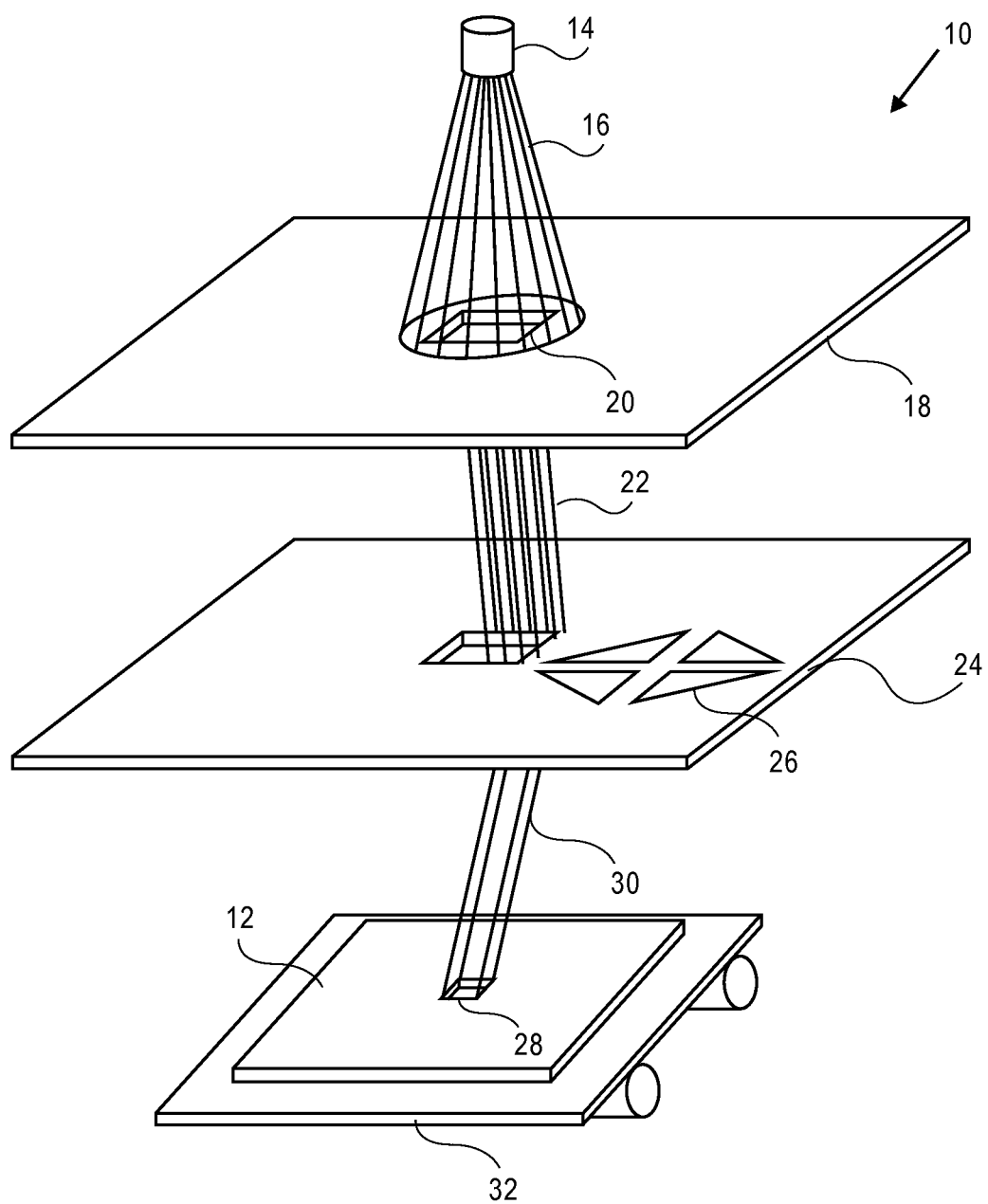
FIG. 1 illustrates an example of a charged particle beam system.

Referring now to the drawings, wherein like numbers refer to like items, FIG. 1 identifies an embodiment of a lithography system, such as a charged particle beam writer system, in this case an electron beam writer system 10, that employs a variable shaped beam (VSB) to manufacture a surface 12 according to the present disclosure. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil mask 24 has formed therein a number of apertures 26 that define various simple shapes such as rectangles and triangles. Each aperture 26 formed in the stencil mask 24 may be used to form a pattern on the surface 12. An electron beam 30 emerges from one of the apertures 26 and is directed onto the surface 12 as a pattern 28. The surface 12 is coated with resist (not shown) which reacts with the electron beam 30. The electron beam 22 may be directed to overlap a variable portion of an aperture 26, affecting the size and shape of the pattern 28. The surface 12 is mounted on a movable platform 32. The platform 32 allows surface 12 to be repositioned so that patterns which are larger than the maximum deflection capability or field size of the charged particle beam 30 may be written to surface 12. In one embodiment the surface 12 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate. In another embodiment the surface 12 may be the surface of a substrate such as a silicon wafer.

The minimum size pattern that can be projected with reasonable accuracy onto a surface 12 is limited by a variety of short-range physical effects associated with the electron beam writer system 10 and with the surface 12. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur.

Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 14 and the exposure time for each shot. Typically the beam intensity remains fixed, and the exposure time is varied to obtain variable shot dosages. The exposure time may be varied to compensate for various long-range effects such as back scatter and fogging in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current invention are targeted for use with charged particle beam writing systems which allow assignment of one of a relatively few dosage levels.

Conventionally, shots are designed so as to completely cover an input pattern with rectangular shots, while avoiding shot overlap wherever possible. Also, all shots are designed to have a normal dosage, which is a dosage at which a relatively large rectangular shot, in the absence of long-range effects, will produce a pattern on the surface which is the same size as is the shot size.

Figure 2A:
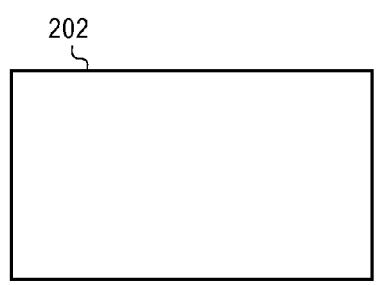
FIG. 2A illustrates an example of a rectangular pattern which is desired to be formed on a surface.
Figure 2B:
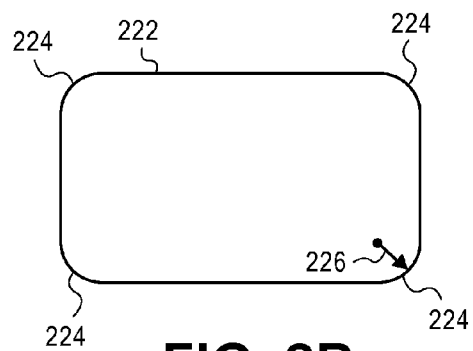
FIG. 2B illustrates an example of corner rounding when forming the pattern of FIG. 2A on a surface.

Conventionally-fractured manhattan shapes having edge lengths of 100 nm or greater are relatively immune to $\beta_f$ variation. This is because manhattan edges of desired mask shapes drawn with edges of VSB shots are insensitive to variation in $\beta_f$. For any designed manhattan shape, however, the 90 degree corners in the designed shape will not be formed as 90 degree corners on a photomask. Instead, the corners will be rounded to a degree determined principally by the value of $\beta_f$. The corner-rounded regions are sensitive to $\beta_f$ even in conventionally-fractured shapes. FIG. 2A illustrates an example of a rectangular shape 202 that may be desired to be formed on a reticle. FIG. 2B illustrates an example of a shape 222 that may be formed on a reticle from shape 202 using a conventional VSB shot. The dimensions of shape 222 are the same as shape 202, except for the corner regions 224. The corner regions 224 of shape 222 are rounded due to $\beta_f$, compared to the sharp corners of shape 202. The radius 226 of the corners 224 depends on the value of $\beta_f$: a larger $\beta_f$ will produce a larger radius of rounding, and a smaller $\beta_f$ will produce a smaller radius of rounding.

Figure 3A:
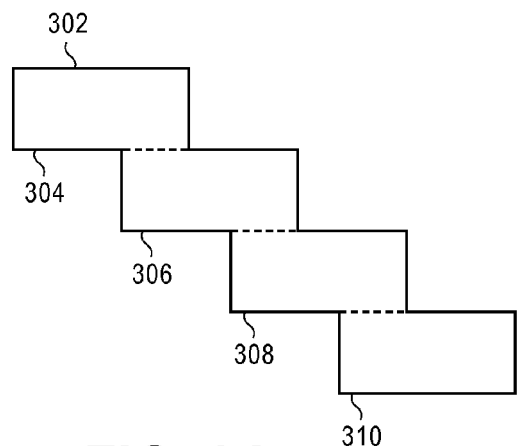
FIG. 3A illustrates an another example of a pattern which is desired to be formed on a surface.
Figure 3B:
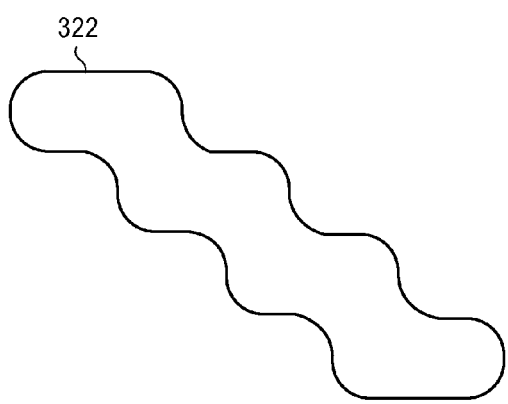
FIG. 3B illustrates an example of corner rounding when forming the pattern of FIG. 3A on a surface.

With the continual advancement in semiconductor technology requiring creation of photomasks with sub-100 nm features, the consequent requirement for higher precision means that conventional fracturing, even for Manhattan shapes, becomes increasingly sensitive to dose margin and other manufacturing variation. Furthermore, when the shapes desired on the masks include small (sub-80 nm) Manhattan jogs, diagonal features, or curvilinear features, conventionally-fractured shapes have increased sensitivity to dose margin, $\beta_f$ and other manufacturing variations. FIG. 3A illustrates an example of a pattern 302 that may be desired to be formed on a reticle. Pattern 302 may be conventionally exposed using four VSB shots, including shot 304, shot 306, shot 308, and shot 310. In pattern 302 boundaries between the shots are illustrated using dashed lines. FIG. 3B illustrates a pattern 322 that may be formed on a reticle from shape 302 using the set of conventional VSB shots 304, 306, 308 and 310. As can be seen, corners on pattern 322 are rounded due to $\beta_f$, with a similar corner radius as is illustrated in shape 222. The pattern 322, however, is relatively more sensitive to $\beta_f$ variation than is the shape 222. In other words, the shape of pattern 322 on the reticle is more heavily affected by variation in $\beta_f$ than is the shape of pattern 222. One factor causing the relatively greater sensitivity of pattern 322 to $\beta_f$ variation compared to shape 222 is the relatively smaller size of the shots used in pattern 322, compared to the shot used in pattern 222.

As indicated above, the edges of manhattan shapes of 100 nm or greater edge lengths are relatively immune to $\beta_f$ variation when conventional fracturing using non-overlapping VSB shots is used. By contrast, the added flexibility of using overlapping shots with dose modulation both increases the opportunity to improve pattern tolerance to manufacturing variation and increases the need to choose, among available solutions, the solution that optimizes for manufacturing variation.

Figure 4A:
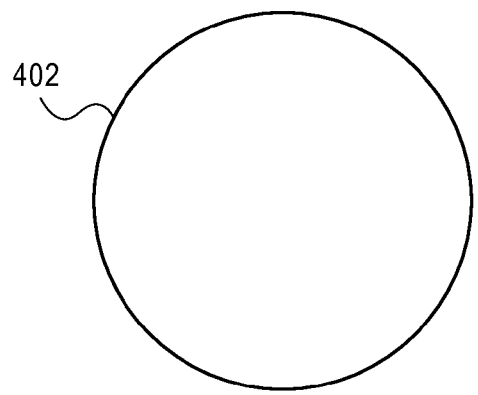
FIG. 4A illustrates an example of a circular pattern which is desired to be formed on a surface.
Figure 4B:
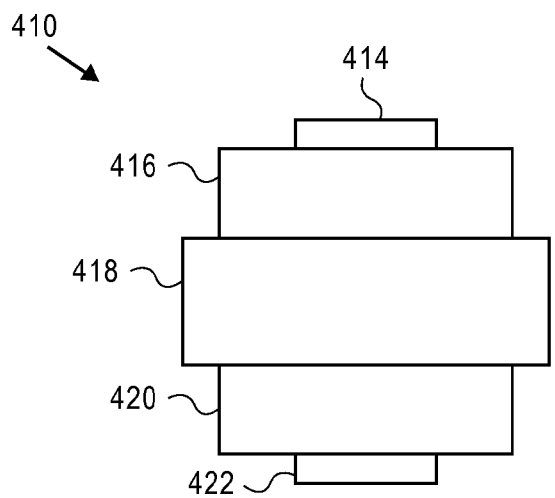
FIG. 4B illustrates an example of a set of conventional non-overlapping VSB shots that can form the circular pattern of FIG. 4A.
Figure 4C:
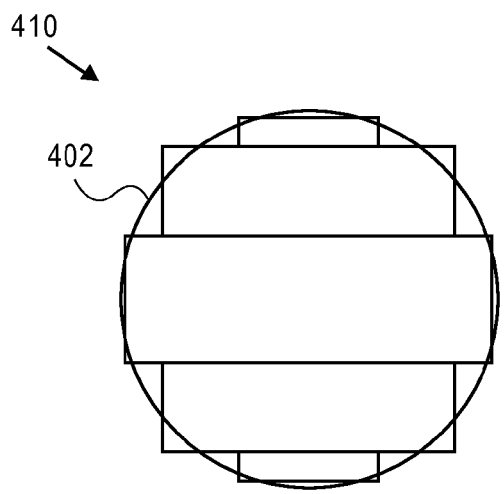
FIG. 4C illustrates the set of shots of FIG. 4B, overlaid with the circular pattern of FIG. 4A.

FIG. 4A illustrates an example of a circular pattern 402 that is desired to be formed on a resist-coated surface, the pattern having a diameter of 350 nm. Circular patterns may be used, for example, to form contacts or vias between layers in a semiconductor manufacturing process. FIG. 4B illustrates a set of conventional non-overlapping VSB shots 410 which may be used to form the pattern 402. The set of shots 410 consists of five shots: shot 414, shot 416, shot 418, shot 420 and shot 422. FIG. 4C illustrates the set of shots 410 of FIG. 4B overlaid with the circular pattern 402 of FIG. 4A. Conventionally, the shots in set of shots 410 will all have the same dosage, before long-range correction is applied.

Figure 5A:
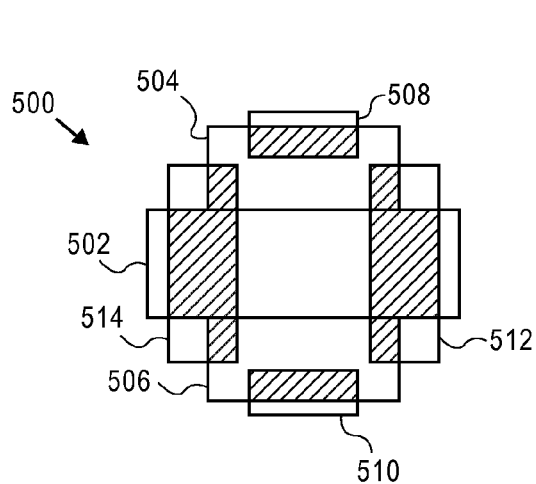
FIG. 5A illustrates an example of a set of overlapping VSB shots which can form the circular pattern of FIG. 4A.
Figure 5B:
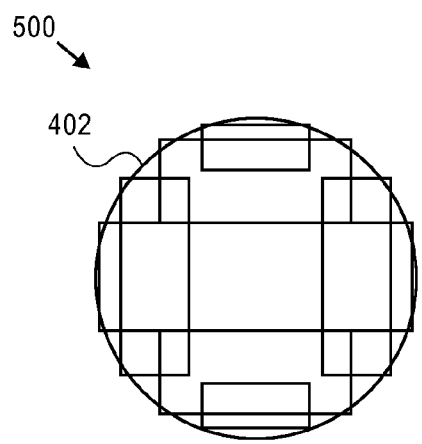
FIG. 5B illustrates the set of shots of FIG. 5A, overlaid with the circular pattern of FIG. 4A.

FIG. 5A illustrates a set of overlapping shots 500 that may also be used to form circular pattern 402. Set of shots 500 consists of seven shots: shot 502, shot 504, shot 506, shot 508, shot 510, shot 512 and shot 514. For clarity, the areas where shots overlap are shaded with cross-hatching. The dosage of the shots in set of shots 500 may vary from shot to shot, before long-range correction. FIG. 5B illustrates the set of shots 500 overlaid with the desired circular pattern 402. Use of model-based fracturing techniques with overlapping shots such as set of shots 500 may allow formation of patterns of a given accuracy with fewer shots, compared to conventional non-overlapping shots, particularly with curvilinear patterns. Similarly, when pattern accuracy is the primary objective, model-based fracturing may be used to form higher quality patterns for a given number of shots, compared to conventional non-overlapping shots, particularly with curvilinear patterns such as circular or nearly-circular patterns.

Figure 6:
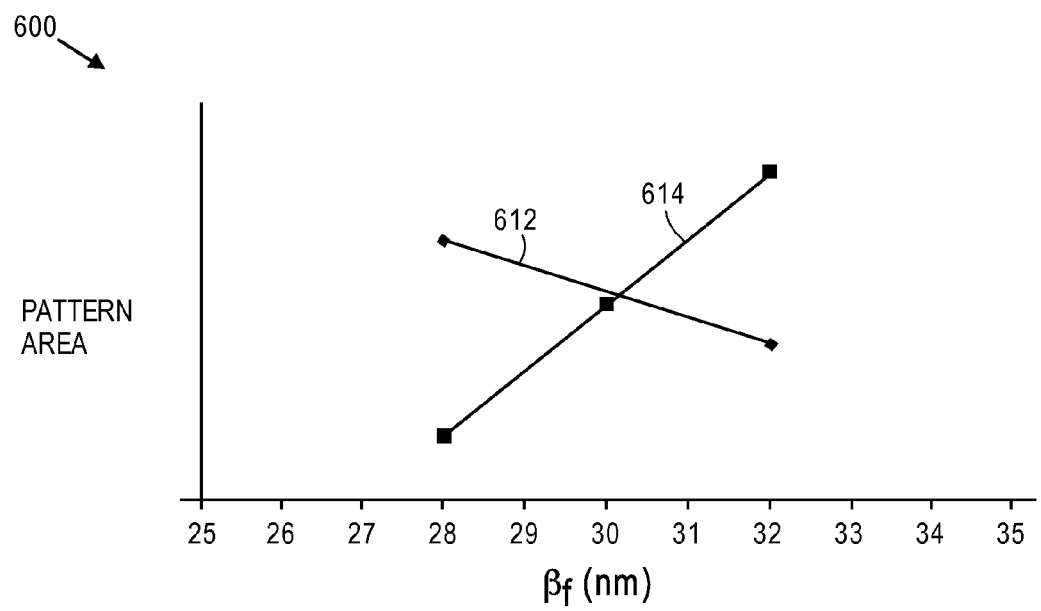
FIG. 6 illustrates an example of a graph relationship between pattern area and $\beta_f$ for two set of shots.

The pattern that will be produced on a surface from a set of charged particle beam shots may be determined through simulation techniques. A set of shots may be simulated for a plurality of values of $\beta_f$ to determine the sensitivity of the pattern to changes in $\beta_f$. FIG. 6 illustrates an example of a graph 600 of the pattern area produced on the surface for various values of $\beta_f$ for set of shots 410 and for set of shots 500. Curve 612 illustrates a calculated pattern area for set of shots 410. Curve 614 illustrates a calculated pattern area for set of shots 500. As can be seen, a variation of $\beta_f$ between 28 nm and 32 nm produces a variation in pattern area for both curve 612 and curve 614. The negative slope of curve 612 indicates that set of shots 410 produces a reduced pattern area as $\beta_f$ increases. By contrast, the positive slope of curve 614 indicates that set of shots 500 produces an increased pattern area as $\beta_f$ increases. The difference between the sign of the slope of curve 612, which is from a set of shots with no overlap, and the sign of the slope of curve 614, which is from a set of shots with overlap which produces varying dosage in different parts of the pattern, suggests that it may be possible to find a dosage distribution for which the pattern area is insensitive to uniform variation in $\beta_f$ for the shots forming the pattern. One embodiment of the current invention comprises adjusting the amount of shot overlap so as to reduce the absolute value of the slope of the pattern area curve with respect to $\beta_f$. For some pattern configurations, a set of shots may be generated which produce a nearly zero slope curve, that is where, over some range of values of $\beta_f$, a change in $\beta_f$ produces no change in pattern area. In other embodiments of the invention, pattern parameters other than pattern area may be adjusted to be insensitive to variations of $\beta_f$. In one embodiment, shot overlap may be adjusted to produce a dosage pattern which produces a surface pattern in which a critical dimension is insensitive to changes in $\beta_f$ over some pre-determined range.

The most significant source of variation of $\beta_f$ across shots is the Coulomb effect, an effect of negatively-charged electrons repelling against each other as the beam crosses over. Coulomb effect is an open area dependent factor, meaning that Coulomb effect depends on the area of the charged particle beam illuminating the surface for a given shot. A larger area increases Coulomb effect, as more electrons in the beam create greater repelling forces. The above described method of optimizing is more effective when the underlying E-beam simulation models the shot size dependency of $\beta_f$.

Figure 7A:
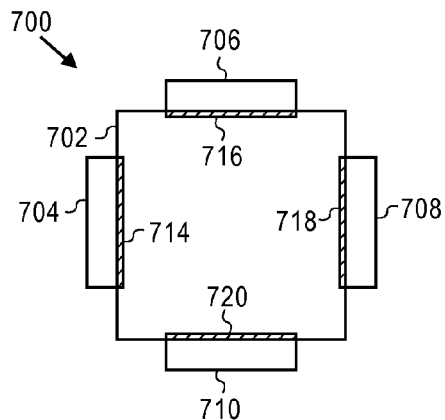
FIG. 7A illustrates an exemplary set of overlapping VSB shots which can form the circular pattern of FIG. 4A according to the current invention.
Figure 7B:
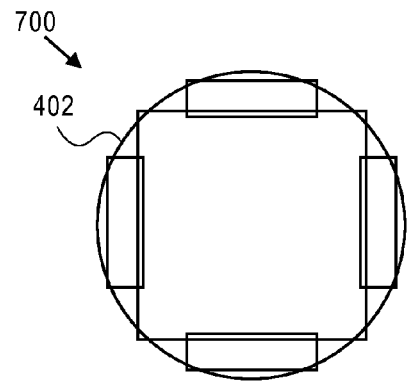
FIG. 7B illustrates the set of shots of FIG. 7A, overlaid with the circular pattern of FIG. 4A.
Figure 8:
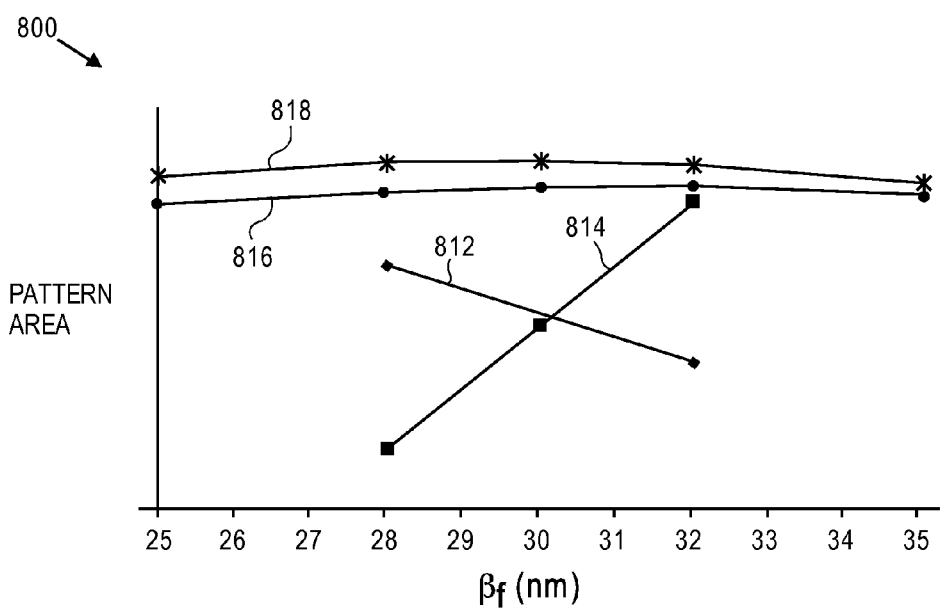
FIG. 8 illustrates an example of a graph relationship between pattern area and $\beta_f$ for four set of shots.

FIG. 7A illustrates an exemplary set of shots 700 which can form pattern 402 on a surface, according one embodiment of the current invention. Set of shots 700 consists of five shots: shot 702, shot 704, shot 706, shot 708 and shot 710. In FIG. 7A the areas of overlap in set of shots 700 are shaded using cross-hatching. Areas of overlap consist of area 714, area 716, area 718 and area 720. The amount of overlap in set of shots 700 is less than that in set of shots 500. FIG. 7B illustrates set of shots 700 overlaid with circular pattern 402. FIG. 8 illustrates an example of a graph 800 of pattern area with respect to $\beta_f$, similar to graph 600. In graph 800, curve 812 corresponds to graph 600 curve 612, which is the variation of pattern area for set of shots 410. Curve 814 corresponds to graph 600 curve 614, which is the variation of pattern area for set of shots 500. Curve 816 illustrates an example of the calculated pattern area with respect to variation of $\beta_f$ for set of shots 700. As can be seen, the absolute value of the slope of curve 816 is smaller than either of the slopes of curve 812 or of curve 814. This indicates that variations of $\beta_f$ will have little effect on the area of the pattern produced on a surface from set of shots 700, relative to set of shots 410 or to set of shots 500. This insensitivity to $\beta_f$ is desirable, indicating that a more accurate pattern can be formed on the surface, in the face of manufacturing process variations that may affect $\beta_f$. In one embodiment, the surface to which the circular pattern is being transferred is a reticle which will be used in an optical lithographic process to transfer the pattern to a substrate such as a silicon wafer. A more accurate pattern on the reticle may produce a more accurate pattern on the wafer, leading, for example, to a higher wafer manufacturing yield.

In some embodiments of the invention, the adjustment of shot overlap, for example to minimize $\beta_f$ sensitivity, may be part of a two step process. In the first step, an initial set of shots is determined that can form a desired pattern on the surface. Shots in this initial set of shots may overlap. This first step may comprise use of charged particle beam simulation to determine the pattern that will be formed on the surface. In the second step, shot overlap is adjusted to reduce sensitivity to $\beta_f$ variation. It is important that the process of adjusting shot overlap to reduce $\beta_f$ sensitivity not significantly change the pattern shape on the surface, the dose margin, or other criteria that affect the quality of the mask. Charged particle beam simulation may also be used in the second step, to determine the pattern that will be produced on the surface for various values of $\beta_f$. In the example of FIG. 7A, the second step of adjusting shot overlap may comprise one or more sub-steps. If charged particle beam simulation of the initial set of shots determines that additional shot overlap is required to reduce $\beta_f$ sensitivity, then two exemplary sub-steps that may be used to accomplish this are as follows:

Move the inside edges of shots 704, 706, 708 and 710 to increase overlap with shot 702. Edge 714 of shot 704 is moved in the positive "x" direction, edge 716 of shot 706 is moved in the negative "y" direction, edge 718 of shot 708 is moved in the negative "x" direction, and edge 720 of shot 710 is moved in the positive "y" direction.

Move the outside edges of shots 704, 706, 708 and 710 in the same direction that the inside edges of these shots were moved in the previous sub-step. Movement of the outside edges is done to prevent to prevent expansion of the pattern shape on the surface due to the additional dosage provided by moving the inside edges in the previous sub-step. The outside edges will generally need to move less than the inside edges were moved.

The two sub-steps may be combined in practice. This example illustrates one technique for adjusting shot overlap while maintaining the integrity of the pattern that will be formed on the surface. In other embodiments of this invention, determination of shots to produce a desired surface pattern and adjustment of shot overlap to reduce $\beta_f$ sensitivity may be combined into a single step or process.

Figure 7C:
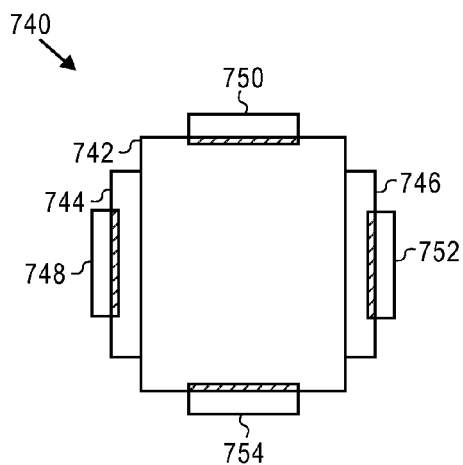
FIG. 7C illustrates another exemplary set of overlapping VSB shots which can form the circular pattern of FIG. 4A according to the current invention.
Figure 7D:
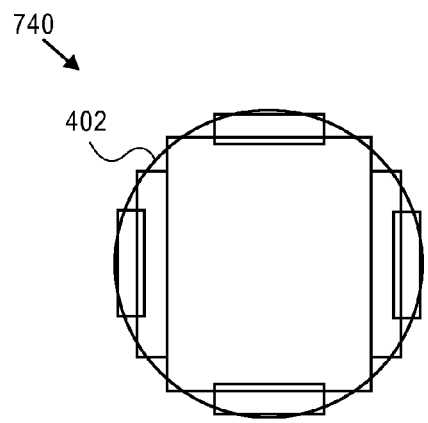
FIG. 7D illustrates the set of shots of FIG. 7C, overlaid with the circular pattern of FIG. 4A.

FIG. 7C illustrates another exemplary set of overlapping shots 740 that can form the circular pattern 402 on a surface. Set of shots 740 consists of seven shots: shot 742, shot 744, shot 746, shot 748, shot 750, shot 752, and shot 754. Although each shot in set of shots 740 overlaps at least one other shot, in other embodiments, some shots in a set of shots may not overlap other shots. In FIG. 7C, the areas of shot overlap are illustrated as cross-hatched. The seven shot set of shots 740 may produce a pattern on the surface which more closely approximates circular pattern 402 than would a pattern produced by the five shot set of shots 700. In FIG. 8 graph 800, curve 818 illustrates an example of the area of the pattern produced by set of shots 740 with varying values of $\beta_f$. As can be seen, the absolute value of the slope of curve 818, like the absolute value of the slope of curve 816, is less than either curve 812 or curve 814.

The near-zero slopes of graph 800 curve 816 and curve 818 can be achieved by adjusting the amount of overlap in a set of shots producing a pattern such as pattern 402. An increasing area of overlap may increase the slope of the curve, and a decreasing amount of overlap may decrease the slope of the curve. Also, a change in shot overlap near the perimeter of a pattern may affect the $\beta_f$ sensitivity of the pattern more than a similar change in shot overlap further from the perimeter of the pattern. In some embodiments of this invention, rule-based techniques may be used to determine the proper shot configurations for reducing $\beta_f$ sensitivity.

Shot overlap may also be used to reduce $\beta_f$ dependency when a plurality of overlapping complex character projection shots are used to form a pattern, and when a combination of complex character projection shots and VSB shots are used to form a pattern.

The calculations described or referred to in this invention may be accomplished in various ways. Generally, calculations may be accomplished by in-process, pre-process or post-process methods. In-process calculation involves performing a calculation when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is precalculating the change in sensitivity of patterns of various types to changes in $\beta_f$ for various amounts of shot overlap change. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

Figure 9:
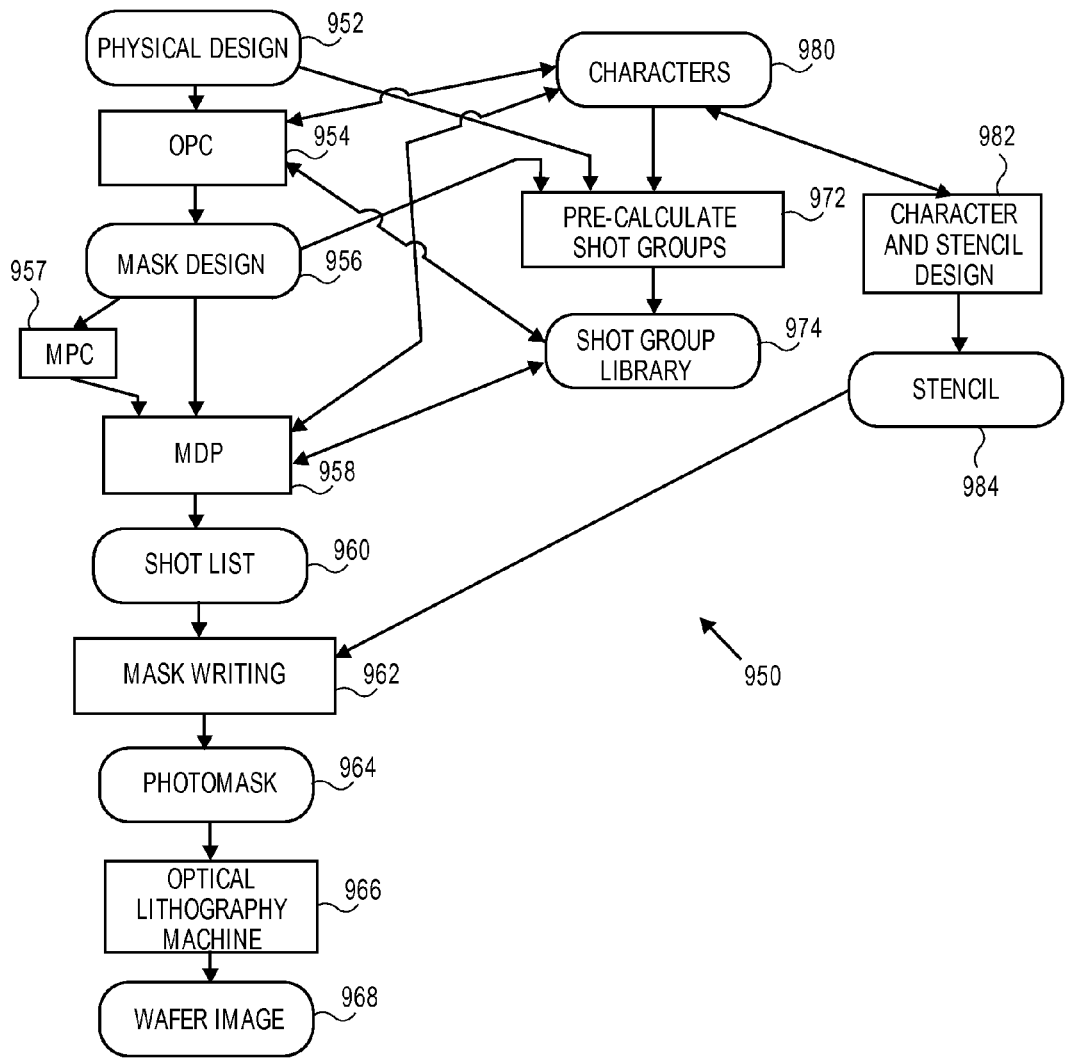
FIG. 9 illustrates an embodiment of a conceptual flow diagram of how to prepare a surface in fabricating a substrate such as an integrated circuit on a silicon wafer.

FIG. 9 is a conceptual flow diagram 950 of how to prepare a reticle for use in fabricating a surface such as an integrated circuit on a silicon wafer. In a first step 952, a physical design, such as a physical design of an integrated circuit, is designed. This can include determining the logic gates, transistors, metal layers, and other items that are required to be found in a physical design such as that in an integrated circuit. The physical design may be rectilinear, partially curvilinear, or completely curvilinear. Next, in a step 954, optical proximity correction is determined. In an embodiment of this disclosure, this can include taking as input a library of pre-calculated shot groups from a shot group library 974. This can also alternatively, or in addition, include taking as input a library of pre-designed characters 980 including complex characters that are to be available on a stencil 984 in a step 962. In an embodiment of this disclosure, an OPC step 954 may also include simultaneous optimization of shot count or write times, and may also include a fracturing operation, a shot placement operation, a dose assignment operation, or may also include a shot sequence optimization operation, or other mask data preparation operations, with some or all of these operations being simultaneous or combined in a single step. The OPC step may create partially or completely curvilinear patterns. The output of the OPC step 954 is a mask design 956.

Mask process correction (MPC) 957 may optionally be performed on the mask design 956. MPC modifies the pattern to be written to the reticle so as to compensate for non-linear effects, such as effects associated with patterns smaller than about 100 nm in conventional optical lithographic masks. MPC may also be used to compensate for non-linear effects affecting EUV masks. If MPC 957 is performed, its output becomes the input for mask data preparation (MDP) step 958.

In a step 958, a mask data preparation (MDP) operation which may include a fracturing operation, a shot placement operation, a dose assignment operation, or a shot sequence optimization may take place. MDP may use as input the mask design 956 or the results of MPC 957. In some embodiments of the present invention, MPC may be performed as part of a fracturing or other MDP operation. Other corrections may also be performed as part of fracturing or other MDP operation, the possible corrections including: forward scattering, resist diffusion, coulomb effect, etching, backward scattering, fogging, loading, resist charging, and EUV midrange scattering. The result of MDP step 958 is a shot list 960. Either the OPC step 954 or of the MDP step 958, or a separate program 972 can include pre-calculating one or more shot groups that may be used for a given input pattern, and storing this information in a shot group library 974. Combining OPC and any or all of the various operations of mask data preparation in one step is contemplated in this disclosure. Mask data preparation step 958, which may include a fracturing operation, may also comprise a pattern matching operation to match pre-calculated shot groups to create a mask that matches closely to the mask design. Mask data preparation step 958 may also comprise adjusting the overlap of shots so that the resulting pattern or portions of the pattern on photomask 964 are insensitive to variations in $\beta_f$. Mask data preparation step 958 may also comprise increasing the dose margin of the pattern on the photomask 964. Mask data preparation may also comprise inputting patterns to be formed on a surface with the patterns being slightly different, selecting a set of characters to be used to form the number of patterns, the set of characters fitting on a stencil mask, the set of characters possibly including both complex and VSB characters, and the set of characters based on varying character dose or varying character position or varying the beam blur radius or applying partial exposure of a character within the set of characters or dragging a character to reduce the shot count or total write time. A set of slightly different patterns on the surface may be designed to produce substantially the same pattern on a substrate. Also, the set of characters may be selected from a predetermined set of characters. In one embodiment of this disclosure, a set of characters available on a stencil in a step 980 that may be selected quickly during the mask writing step 962 may be prepared for a specific mask design. In that embodiment, once the mask data preparation step 958 is completed, a stencil is prepared in a step 984. In another embodiment of this disclosure, a stencil is prepared in the step 984 prior to or simultaneous with the MDP step 958 and may be independent of the particular mask design. In this embodiment, the characters available in the step 980 and the stencil layout are designed in step 982 to output generically for many potential mask designs 956 to incorporate patterns that are likely to be output by a particular OPC program 954 or a particular MDP program 958 or particular types of designs that characterizes the physical design 952 such as memories, flash memories, system on chip designs, or particular process technology being designed to in physical design 952, or a particular cell library used in physical design 952, or any other common characteristics that may form different sets of slightly different patterns in mask design 956. The stencil can include a set of characters, such as a limited number of characters that was determined in the step 958.

The shot list 960 is used to generate a surface in a mask writing step 962, which uses a charged particle beam writer such as an electron beam writer system. Mask writing step 962 may use stencil 984 containing both VSB apertures and a plurality of complex characters, or may use a stencil comprising only VSB apertures. The electron beam writer system projects a beam of electrons through the stencil onto a surface to form patterns in a surface such as a reticle, which is then processed to become a photomask 964. The completed photomask 964 may then be used in an optical lithography machine, which is shown in a step 966. Finally, in a step 968, a substrate such as a silicon wafer is produced. As has been previously described, in step 980 characters may be provided to the OPC step 954 or the MDP step 958. The step 980 also provides characters to a character and stencil design step 982 or a shot group pre-calculation step 972. The character and stencil design step 982 provides input to the stencil step 984 and to the characters step 980. The shot group generation step 972 provides information to the shot group library 974. Also, the shot group pre-calculation step 972 may use as input the physical design 952 or the mask design 956, and may pre-calculate one or more shot groups, which are stored in a shot group library 974.

Figure 10:
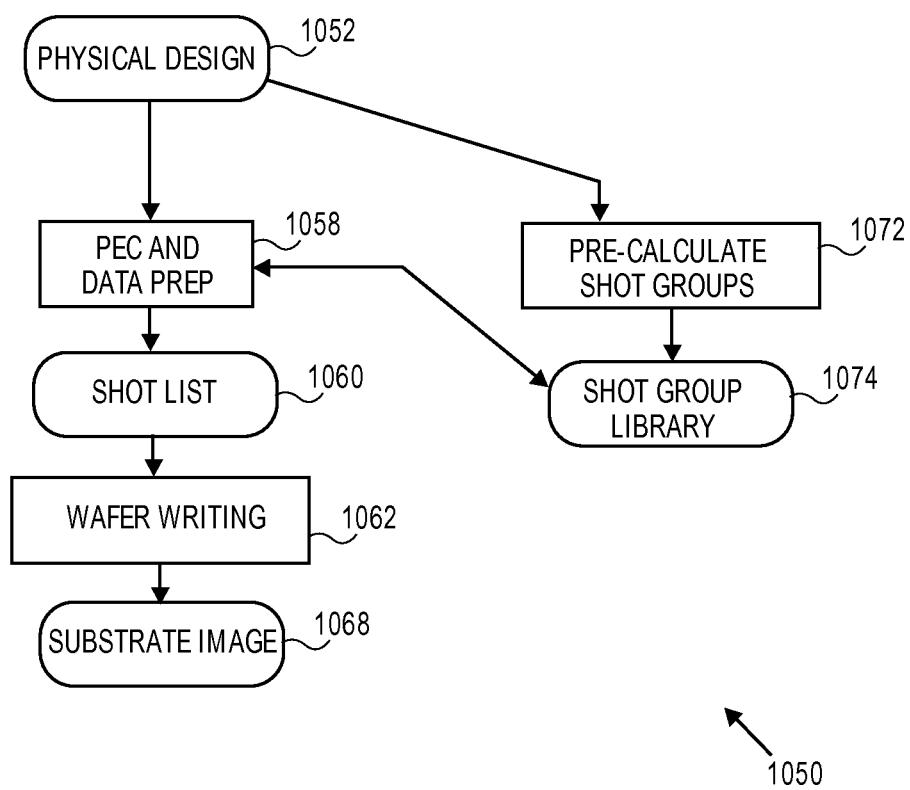
FIG. 10 illustrates an embodiment of a conceptual flow diagram of how to prepare a surface in fabricating a substrate such as an integrated circuit on a silicon wafer.

Referring now to FIG. 10, another conceptual flow diagram 1050 of how to prepare a surface which is directly written on a substrate such as a silicon wafer is shown. In a first step 1052, a physical design, such as a physical design of an integrated circuit is determined. This may be an ideal pattern that the designer wants transferred onto a substrate. The physical design may be rectilinear, partially curvilinear, or completely curvilinear. Next, in a step 1058, proximity effect correction (PEC), and other data preparation (DP) steps such as fracturing are performed to prepare input data to a substrate writing device. The step 1058 may comprise adjusting shot overlap so that the substrate image 1068 is insensitive to variations in $\beta_f$. The step 1058 may also comprise inputting possible glyphs or parameterized glyphs from step 1074, the glyphs being based on possibly overlapping VSB shots, and the glyphs being determined using a calculation of varying a shot dose or varying a shot position in glyph generation step 1072. The step 1058 may also comprise pattern matching to match glyphs to create a wafer image that matches closely to the physical design created in the step 1052. Iterations, potentially including only one iteration where a correct-by-construction "deterministic" calculation is performed, of pattern matching, dose assignment, and equivalence checking may also be performed. The result of step 1058 is a shot list 1060, which is then used to prepare a wafer in a wafer writing step 1062. In one embodiment, wafer writing 1062 may be accomplished using an electron beam writer system. The electron beam writer system projects a beam of electrons through an adjustable aperture onto a surface to form patterns on substrate 1068 such as a silicon wafer. A shot group pre-calculation step 1072 provides information to the shot group library 1074. Also, the shot group pre-calculation step 1072 may use as input the physical design 1052, and may pre-calculate one or more shot groups, which are stored in a shot group library 1074. The step 1062 may include repeated application as required for each layer of processing, potentially with some processed using the methods described in association with FIG. 9, and others processed using the methods outlined above with respect to FIG. 10, or others produced using any other wafer writing method to produce integrated circuits on the silicon wafer.

The fracturing, mask data preparation, proximity effect correction and shot group creation flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, proximity effect correction and optical proximity correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for manufacturing a surface using a charged particle beam lithographic process comprising a beam blur ($\beta_f$), the method comprising the steps of:
    determining a plurality of charged particle beam shots that will form a pattern on the surface, wherein some shots in the plurality of shots overlap each other;
    reducing pattern sensitivity to variation in $\beta_f$; and
    forming the pattern on the surface with the plurality of shots.

2. The method of claim 1 wherein the pattern sensitivity to $\beta_f$ is reduced by varying the overlap among shots in the plurality of shots.

3. The method of claim 1 wherein the sensitivity comprises critical dimension sensitivity.

4. The method of claim 1 wherein the step of reducing comprises using charged particle beam simulation.

5. The method of claim 4 wherein the charged particle beam simulation includes at least one of a group consisting of forward scattering, backward scattering, resist diffusion, Coulomb effect, etching, fogging, loading and resist charging.

6. A method for manufacturing an integrated circuit using an optical lithographic process, the optical lithographic process using a reticle, wherein the reticle is manufactured using a charged particle beam lithographic process comprising a beam blur ($\beta_f$), the method comprising the steps of:
    determining a plurality of charged particle beam shots that will form a pattern on the reticle, wherein some shots in the plurality of shots overlap each other;
    reducing pattern sensitivity to variation in $\beta_f$; and
    forming the pattern on the reticle with the plurality of shots.

7. The method of claim 6 wherein the pattern sensitivity to $\beta_f$ is reduced by varying the overlap among shots in the plurality of shots.

8. The method of claim 6 wherein the step of reducing comprises using charged particle beam simulation.

9. The method of claim 8 wherein the charged particle beam simulation includes at least one of a group consisting of forward scattering, backward scattering, resist diffusion, Coulomb effect, etching, fogging, loading and resist charging.

10. A method for fracturing or mask data preparation or mask process correction for use with a charged particle beam lithographic process comprising a beam blur ($\beta_f$), the method comprising the steps of:
    determining a plurality of charged particle beam shots that will form a pattern on a surface, wherein some shots in the plurality of shots overlap each other; and
    reducing pattern sensitivity to variation in $\beta_f$.

11. The method of claim 10 wherein shots in the plurality of shots comprise variable shaped beam (VSB) shots.

12. The method of claim 10 wherein the pattern sensitivity to $\beta_f$ is reduced by varying the overlap among shots in the plurality of shots.

13. The method of claim 12 wherein the shot overlap is near the perimeter of the pattern on the surface.

14. The method of claim 10 wherein the step of reducing comprises using an optimization technique.

15. The method of claim 14 wherein the sensitivity is minimized or nearly minimized, within a pre-determined range of $\beta_f$.

16. The method of claim 10 wherein the step of reducing comprises a rule-based technique.

17. The method of claim 10 wherein in the step of determining, dose margin of the pattern on the surface is increased.

18. The method of claim 10 wherein the sensitivity comprises area sensitivity.

19. The method of claim 18 wherein the shot overlap comprises an area, and wherein the step of reducing comprises the steps of:
    simulating the pattern on the surface that will be formed by the plurality of shots for a plurality of values of $\beta_f$;
    increasing the area of shot overlap if the simulation indicates that the area of the pattern on the surface decreases with increasing $\beta_f$; and
    decreasing the area of shot overlap if the simulation indicates that the area of the pattern on the surface increases with increasing $\beta_f$.

20. The method of claim 19 wherein a non-overlapping shot area is reduced if the area of shot overlap is increased, and wherein the non-overlapping shot area is increased if the area of shot overlap is reduced.

21. The method of claim 10 wherein the sensitivity comprises critical dimension sensitivity.

22. The method of claim 10 wherein the pattern comprises a circular or nearly-circular pattern.

23. The method of claim 10 wherein the surface is a reticle.

24. The method of claim 10 wherein the step of reducing comprises using charged particle beam simulation.

25. The method of claim 24 wherein the charged particle beam simulation includes at least one of a group consisting of forward scattering, backward scattering, resist diffusion, Coulomb effect, etching, fogging, loading and resist charging.

26. A system for fracturing or mask data preparation or mask process correction for use with a charged particle beam lithographic process comprising a beam blur ($\beta_f$), the system comprising:
   a device capable of determining a plurality of charged particle beam shots that will form a pattern on a surface, wherein some shots in the plurality of shots overlap each other; and
   a device capable of reducing pattern sensitivity to variation in $\beta_f$.

27. The system of claim 26 wherein the pattern sensitivity to $\beta_f$ is reduced by varying the overlap among shots in the plurality of shots.

28. The system of claim 26 wherein the device capable of reducing comprises charged particle beam simulation.

* * * * *